US012615971B2

(12) United States Patent
Xu et al.

(10) Patent No.: US 12,615,971 B2
(45) Date of Patent: Apr. 28, 2026

(54) RESISTIVE RANDOM ACCESS MEMORY AND METHOD OF PREPARING THE SAME

(71) Applicant: INSTITUTE OF MICROELECTRONICS, CHINESE ACADEMY OF SCIENCES, Beijing (CN)

(72) Inventors: Xiaoxin Xu, Beijing (CN); Xiaoyan Li, Beijing (CN); Danian Dong, Beijing (CN); Jie Yu, Beijing (CN); Hangbing Lv, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 429 days.

(21) Appl. No.: 18/254,981

(22) PCT Filed: Dec. 14, 2020

(86) PCT No.: PCT/CN2020/136003
§ 371 (c)(1),
(2) Date: May 30, 2023

(87) PCT Pub. No.: WO2022/116257
PCT Pub. Date: Jun. 9, 2022

(65) Prior Publication Data
US 2024/0023469 A1     Jan. 18, 2024

(30) Foreign Application Priority Data
Dec. 4, 2020    (CN) ......................... 202011413926.5

(51) Int. Cl.
*H10N 70/00*        (2023.01)
*G11C 13/00*        (2006.01)

(52) U.S. Cl.
CPC ..... *H10N 70/8833* (2023.02); *G11C 13/0007* (2013.01); *H10N 70/023* (2023.02); *H10N 70/026* (2023.02); *H10N 70/841* (2023.02)

(58) Field of Classification Search
CPC ........................ H10N 70/8833; G11C 13/0007
See application file for complete search history.

(56) References Cited

FOREIGN PATENT DOCUMENTS

| | | | |
|---|---|---|---|
| CN | 102593351 A | * | 7/2012 |
| CN | 102610749 A | | 7/2012 |

(Continued)

OTHER PUBLICATIONS

Office Action for Chinese Application No. 202011413926.5, Dated Jun. 27, 2025, 12 pages including English Translation.

(Continued)

*Primary Examiner* — Marvin Payen
(74) *Attorney, Agent, or Firm* — Christopher R. Christenson; Kelly, Holt & Christenson, P.L.L.C.

(57) ABSTRACT

The present disclosure provides a resistive random access memory and a method of preparing the same. The resistive random access memory includes: a resistive layer, an upper electrode and a barrier structure. The resistive layer is arranged on a substrate; the upper electrode is arranged on the resistive layer; and the barrier structure is arranged between the resistive layer and the upper electrode, and the barrier structure is configured for electrons to pass through a conduction band of the barrier structure when a device performs an erasing operation, so as to avoid forming of a defect in the resistive layer and causing a reverse breakdown of the resistive layer.

11 Claims, 4 Drawing Sheets

(56)         References Cited

FOREIGN PATENT DOCUMENTS

| CN | 103117359 A | 4/2015 |
| CN | 107068860 A | 8/2017 |
| CN | 111564555 A | 8/2020 |

OTHER PUBLICATIONS

International Search Report and Written Opinion fort Chinese Application No. PCT/CN2020/136003, Dated Sep. 8, 2021, 8 pages including English Translation.

* cited by examiner 150
140
130
120
110
100

(a)

(b)

RESISTIVE RANDOM ACCESS MEMORY AND METHOD OF PREPARING THE SAME

CROSS REFERENCE

This application is a Section 371 National Stage Application of International Application No. PCT/CN2020/136003, filed on Dec. 14, 2020, entitled "RESISTIVE RANDOM ACCESS MEMORY AND METHOD OF PRE-PARING THE SAME", which claims priority to Chinese Patent Application No. 202011413926.5, filed on Dec. 4, 2020, the content of which are incorporated herein by reference in their entirety.

TECHNICAL FIELD

The present disclosure relates to the field of memory technology, and in particular to a resistive random access memory and a method of preparing the same.

BACKGROUND

The resistive random access memory is a new type of non-volatile memory technology, which has advantages of simple structure, low operating voltage and easy integration, and has important application prospects in non-volatile storing, logic circuits and neuromorphic computing.

Under an excitation of an external electric field, a conductive filament in a dielectric layer of a resistive random access memory may be formed and broken, thus a resistance value of the resistive random access memory may be cyclically switched between a high resistance state and a low resistance state. The formation and the breakage of the conductive filament respectively correspond to a writing operation and an erasing operation of the resistive random access memory. However, during an erasing process of a device, a reverse breakdown is prone to occur since a relatively large current flowing through the device, resulting in a failure of the device.

SUMMARY

In an aspect of the present disclosure, a resistive random access memory is provided, including: a resistive layer arranged on a substrate, and the resistive layer is configured to cause a device to generate a high resistance state or a low resistance state when the device performs a writing operation or an erasing operation; an upper electrode, arranged on the resistive layer, and the upper electrode is configured as an extraction electrode of the device; and a barrier structure arranged between the resistive layer and the upper electrode, and the barrier structure is configured for an electron to pass through a conduction band of the barrier structure when the device performs the erasing operation, so as to avoid form-ing of a defect in the resistive layer and causing a reverse breakdown of the resistive layer.

According to the embodiments of the present disclosure, the barrier structure includes: a barrier layer arranged on the resistive layer, and the barrier layer is configured as a storage layer of oxygen ions when the device performs the erasing operation, so that the electron passes through the conduction band of the barrier layer; and an intercalation layer arranged between the barrier layer and the upper electrode, and the intercalation layer is configured as an auxiliary storage layer of the oxygen ions when the device performs the erasing operation, so as to further prevent the oxygen ions from directly entering the upper electrode.

According to the embodiments of the present disclosure, wherein a material of the resistive layer is Ta2O5; wherein a material of the barrier layer is TaOx, wherein $x \in [1.1, 1.8]$; wherein a material of the intercalation layer is at least one of Ta, Ti, a metal oxide, an amorphous silicon, an amorphous carbon and a graphene, wherein a thickness of the interca-lation layer is 2 nm-20 nm; and wherein a barrier between the barrier layer and the resistive layer is 0.45 eV-0.65 eV.

According to the embodiments of the present disclosure, the resistive random access memory further includes: a lower electrode arranged between the resistive layer and the substrate, and the lower electrode is configured as another extraction electrode of the device.

According to the embodiments of the present disclosure, wherein a material of the lower electrode is at least one of TiN and TaN; wherein a material of the upper electrode is at least one of Ir, Al, Ru, Pd, TiN and TaN; and wherein a thickness of the lower electrode and a thickness of the upper electrode are 20 nm-500 nm, respectively.

In another aspect of the present disclosure, a method of preparing the resistive random access memory as described above is provided, including: forming a resistive layer on a substrate; forming a barrier structure on the resistive layer; forming an upper electrode on the barrier structure; wherein the barrier structure is configured for electrons to pass through a conduction band of the barrier structure when a device performs an erasing operation, so as to avoid forming of a defect in the resistive layer and causing a reverse breakdown of the resistive layer.

According to the embodiments of the present disclosure, the forming a barrier structure on the resistive layer includes: forming a barrier layer on the resistive layer, wherein the barrier layer is configured as a storage layer of oxygen ions when the device performs the erasing operation, so as to allow the electrons to pass through a conduction band of the barrier layer; and forming an intercalation layer on the barrier layer, wherein the intercalation layer is con-figured as an auxiliary storage layer of the oxygen ions when the device performs the erasing operation, so as to further prevent the oxygen ions from directly entering the upper electrode.

According to the embodiments of the present disclosure, the forming a barrier layer on the resistive layer includes: preparing the barrier layer by adjusting an oxygen flow ratio of a reactive sputtering process; and wherein the oxygen flow ratio is a ratio r between an oxygen flow sccmO and an inert gas flow sccmD, wherein $r \in [r1, r2]$, r1=sccmO: sccmD=2 sccm:50 sccm, r2=sccmO:sccmD=8 sccm:50 sccm.

According to the embodiments of the present disclosure, a preparation condition of the reactive sputtering process further includes: a substrate temperature is a room tempera-ture, a power is 400 W, and an air pressure is 3 mtorr.

According to the embodiments of the present disclosure, the forming an intercalation layer on the barrier layer includes: preparing the intercalation layer by a sputtering process, an atomic layer deposition process, a physical vapor deposition process or a chemical vapor deposition process.

According to the embodiments of the present disclosure, the forming a resistive layer on a substrate includes: pre-paring the resistive layer by a reactive sputtering process, an atomic layer deposition process, a thermal oxidation pro-cess, a magnetron sputtering process or an ion beam sput-tering process.

According to the embodiments of the present disclosure, a preparation condition of the reactive sputtering process includes: an oxygen flow ratio is a ratio s between an oxygen flow sccmO and an inert gas flow sccmD, wherein s∈[s1, s2], s1=sccmO:sccmD=12 sccm:50 sccm, s2=sccmO: sccmD=20 sccm:50 sccm; and a substrate temperature is a room temperature, a power is 400 W, and an air pressure is 3 mtorr.

According to the embodiments of the present disclosure, before forming a resistive layer on a substrate, the method further includes: forming a lower electrode on the substrate; and wherein a preparation process of the lower electrode and the upper electrode is a sputtering process, an atomic layer deposition process, a physical vapor deposition process or a chemical vapor deposition process.

DETAILED DESCRIPTION OF EMBODIMENTS

Figure 1:
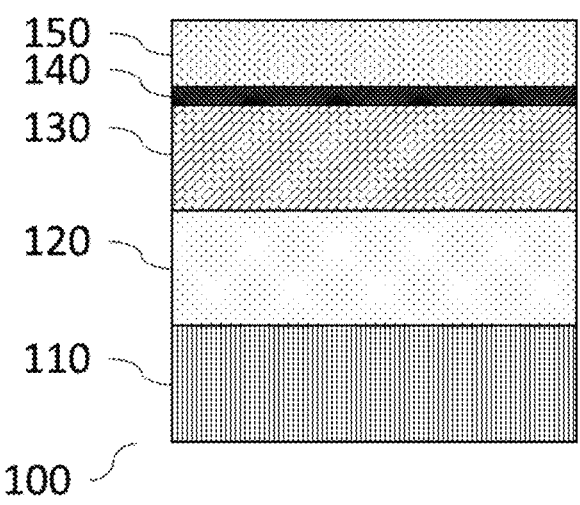
FIG. 1 schematically shows a structural composition diagram of a resistive random access memory according to an embodiment of the present disclosure.

In order to make objectives, technical solutions and advantages of the present disclosure clearer, the present disclosure will be further described in detail below in combination with specific embodiments and with reference to the accompanying drawings.

It should be noted that, in the accompanying drawings or in the context of the specification, implementations that are not shown or described are in forms known to those of ordinary skill in the art, thus are not described in detail. In addition, the above definitions of various elements and methods are not limited to the various specific structures, shapes or manners mentioned in the embodiments, and those skilled in the art may make simple modifications or replacements to them.

It should also be noted that the directional terms mentioned in the embodiments, such as "up", "down", "front", "rear", "left" and "right", etc., are only directions with reference to the drawings, and not used to limit the protection scope of the present disclosure. Throughout the drawings, the same elements are indicated by the same or similar reference numerals. Conventional structures or constructions are omitted when they may obscure the understanding of the present disclosure.

Moreover, shapes and sizes of various components in the drawings do not reflect actual sizes and proportions, but only illustrate contents of the embodiments of the present disclosure. Additionally, in a claim, any reference numeral placed between parentheses shall not be construed as limiting the claim.

Furthermore, the word "include"/"comprise" does not exclude the presence of elements or steps not listed in the claims. The word "a" or "an" preceding an element does not exclude the presence of a plurality of such elements.

Ordinal numbers such as "first", "second" and "third" in the specification and claims are used to modify corresponding elements. The ordinal numbers themselves neither mean that the elements have any ordinal numbers, nor represent a sequence of one element with respect to another or a sequence in which it is manufactured. These ordinal numbers are used only to clearly distinguish one element having a certain designation from another element with the same designation.

Those skilled in the art may understand that modules in an apparatus in an embodiment may be adaptively changed and arranged in one or more apparatuses different from that embodiment. Modules or units or assemblies in the embodiments may be combined into one module or unit or assembly, furthermore, they may be divided into a plurality of submodules or subunits or subassemblies. All features disclosed in the present specification (including accompanying claims, abstract and drawings) and all processes and units of any method or apparatus disclosed in this manner may be combined in any manner, except that at least some of such features and/or processes or units are mutually exclusive. Each feature disclosed in the present specification (including accompanying claims, abstract and drawings) may be replaced by an alternative feature providing the same, equivalent or similar objective, unless expressly stated otherwise. Moreover, in a unit claim enumerating several devices, several of these devices may be embodied by the same hardware item.

Similarly, it should be understood that in order to streamline the present disclosure and to facilitate understanding of one or more of the various disclosed aspects, in the above description of the exemplary embodiments of the present disclosure, various features of the present disclosure are sometimes grouped together in a single embodiment, drawing, or description thereof. However, the method of the present disclosure should not to be interpreted as reflecting an intention that the claimed disclosure claims more features than features expressly recited in each claim. More exactly, as the following claims reflect, the disclosed aspects are less than all features of a single embodiment previously disclosed. Therefore, the claims according to the specific embodiments are hereby expressly incorporated into the specific embodiments, and each claim itself is taken as a separate embodiment of the present disclosure.

In order to solve the technical problem in the prior art that the resistive random access memory is prone to a reverse breakdown due to a large current flowing therethrough during the erasing process, resulting in a device failure, the present disclosure provides a resistive random access memory and a method of preparing the same.

Figure 2A:
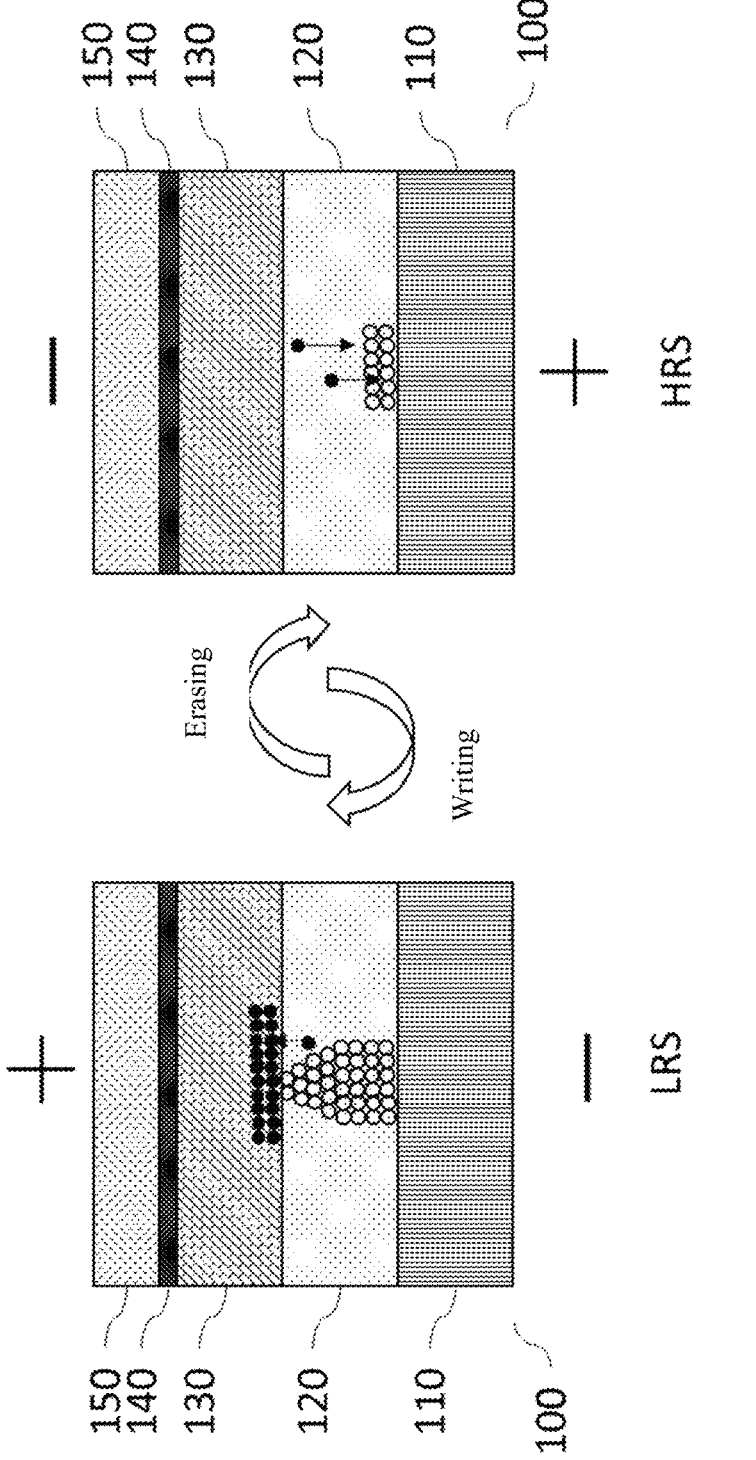
FIG. 2A schematically shows a working principle diagram of a resistive random access memory according to an embodiment of the present disclosure.
Figure 2B:
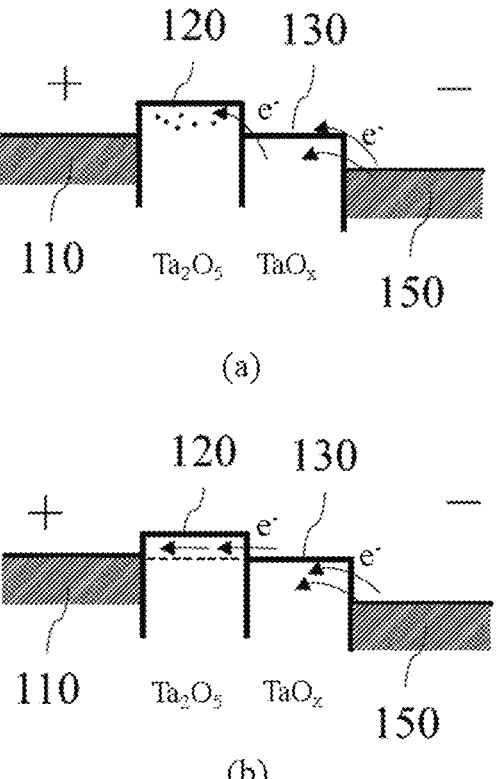
FIG. 2B schematically shows a working principle diagram of a barrier layer according to an embodiment of the present disclosure.

As shown in FIG. 1, FIG. 2A and FIG. 2B, according to an aspect of the present disclosure, there is provided a resistive random access memory 100, including: a resistive layer 120, an upper electrode 150, and a barrier structure. The resistive layer 120 is arranged on a substrate, and is configured to cause a device to generate a high resistance state or a low resistance state when the device performs a writing operation or an erasing operation. The upper electrode 150 is arranged on the resistive layer 120, and is configured as an extraction electrode of the device. The barrier structure is arranged between the resistive layer 120 and the upper electrode 150, and is configured to allow an electron to pass through a conduction band of the barrier structure when the device performs the erasing operation, so as to avoid forming of defects in the resistive layer 120 and causing a reverse breakdown of the resistive layer 120.

The barrier structure includes an oxide layer not completely proportioned. As the barrier structure is formed between the resistive layer 120 and the upper electrode 150, during an erasing operation of the device, when an applied erasing voltage gradually increases, a conduction band energy level of the resistive layer 120 may be leveled with a conduction band energy level of the oxide layer, electrons pass through the conduction band of the barrier structure so as to avoid forming of too many defects in the resistive layer 120. Therefore, a reverse breakdown may not occur on the device, so that a durability of the device may be further improved.

As shown in FIG. 1, FIG. 2A and FIG. 2B, according to an embodiment of the present disclosure, the barrier structure includes: a barrier layer 130 and an intercalation layer 140. The barrier layer 130 is arranged on the resistive layer 120, and is configured as a storage layer of oxygen ions when the device performs the erasing operation, so as to allow the electrons to pass through the conduction band of the barrier layer 130. The intercalation layer 140 is arranged between the barrier layer 130 and the upper electrode 150, and is configured as an auxiliary storage layer of the oxygen ions when the device performs the erasing operation, so as to further prevent the oxygen ions from directly entering the upper electrode 150.

As shown in FIG. 2A, when a forward voltage is applied on the upper electrode 150, the oxygen ions in the resistive layer 120 migrate toward the upper electrode 150 under an action of an electric field and are stored in the barrier layer 130 and the intercalation layer 140 of the barrier structure, they finally form conductive filaments composed of oxygen vacancies in the resistive layer 120, the device turns to the low resistance state (i.e., LRS), and the writing operation is completed. When a reverse voltage is applied on the upper electrode 150, the oxygen ions stored in the barrier layer 130 and the intercalation layer 140 migrate back to the resistive layer 120 under the action of the electric field, they recombine with the oxygen vacancies to break the above-mentioned conductive filaments composed of the oxygen vacancies, the device returns to the high resistance state (i.e., HRS), and the erasing operation is completed.

For a resistive random access memory that lacks the barrier structure in the embodiment of the present disclosure, generally, when an applied reset voltage is too large, a reverse voltage that an electrolyte layer of the resistive layer 120 bears is too high, which may directly result in a reverse breakdown of the electrolyte layer of the resistive layer 120, leading to a device failure.

As shown in FIG. 1 to FIG. 2B, according to the embodiment of the present disclosure, a material of the resistive layer 120 is $Ta_2O_5$; a material of the barrier layer 130 is $TaO_x$, wherein $x \in [1.1, 1.8]$; a material of the intercalation layer 140 is at least one of Ta, Ti, a metal oxide, an amorphous silicon, an amorphous carbon, and a graphene, wherein a thickness of the intercalation layer 140 is 2 nm-20 nm; a barrier between the barrier layer and the resistive layer is 0.45 eV-0.65 eV. In the embodiment of the present disclosure, an O/Ar flow ratio of 3 sccm:50 sccm to 6 sccm:50 sccm is used when forming the barrier layer 130 of $TaO_x$, so that the $TaO_x$ material of the barrier layer 130 is an oxide not completely proportioned. There is a barrier of 0.45 eV-0.65 eV between the $TaO_x$ material of the barrier layer 130 and the $Ta_2O_5$ material of the resistive layer 120.

Therefore, as shown in FIG. 2B-(a), when the device is under a reverse erasing voltage after performing the erasing operation, the electrons of the device are injected from the upper electrode 150, they overcome the barrier by passing through the $TaO_x$ barrier layer 130 and enter the $Ta_2O_5$ resistive layer 120. As the applied reverse voltage gradually increases, shallow energy level defects in the $Ta_2O_5$ resistive layer 120 are gradually filled, and the conduction band energy level thereof gradually decreases. As shown in FIG. 2B-(b), when the applied voltage reaches a certain value, the electrons migrating from the $TaO_x$ barrier layer 130 may directly pass through the conduction band energy level of the $Ta_2O_5$ resistive layer 120, thereby forming a relatively large current. After the voltage is removed, the conduction band energy level of the $Ta_2O_5$ resistive layer 120 is raised so that the electrons may not pass through, and the device returns to the high resistance state (HRS). A modulation effect of the conduction band energy level between the $Ta_2O_5$ resistive layer 120 and the $TaO_x$ barrier layer 130 avoids forming too many defects in the $Ta_2O_5$ resistive layer 120, thereby avoiding the reverse breakdown problem during the erasing process.

It should be noted that the intercalation layer 140 plays a similar role to the $TaO_x$ barrier layer 130 in the above-mentioned process, which is to further store the oxygen ions flowing toward the upper electrode 150 on the basis of the $TaO_x$ barrier layer 130 storing the oxygen ions, so that the intercalation layer acts as the auxiliary storage layer of the oxygen ions of the barrier structure to further avoid the reverse breakdown of the $Ta_2O_5$ resistive layer 120 during the erasing and writing operations. The $TaO_x$ barrier layer 130 may be a main storage layer of the oxygen ions of the barrier structure in the embodiment of the present disclosure.

As shown in FIG. 1 to FIG. 2B, according to the embodiment of the present disclosure, the resistive random access memory 100 further includes a lower electrode 110. The lower electrode 110 is arranged between the resistive layer 120 and the substrate, and is configured as another extraction electrode of the device. According to the embodiment of the present disclosure, a material of the lower electrode is at least one of TiN and TaN; a material of the upper electrode is at least one of Ir, Al, Ru, Pd, TiN and TaN; and a thickness of the lower electrode and a thickness of the upper electrode are 20 nm-500 nm. Therefore, both the upper electrode and the lower electrode have a conductive effect, so as to serve as an upper extraction electrode and a lower extraction electrode of the device.

Figure 3:
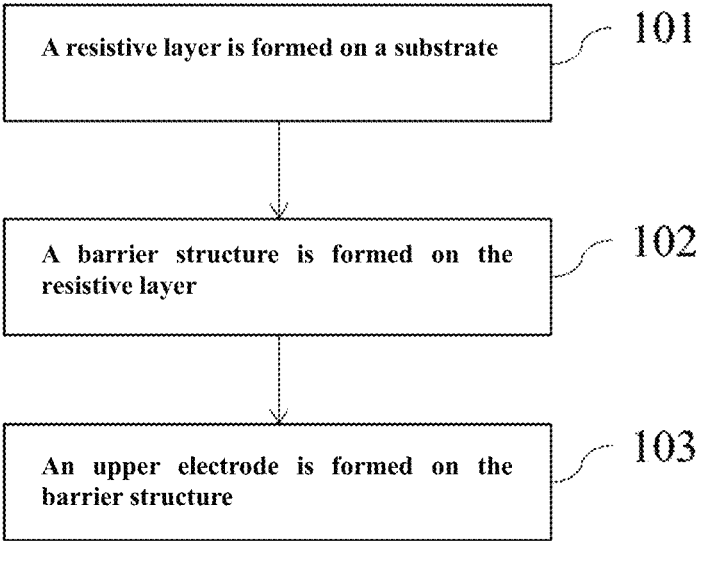
FIG. 3 schematically shows a flowchart of a method of preparing a resistive random access memory according to an embodiment of the present disclosure.

As shown in FIG. 1 and FIG. 3, according to another aspect of the present disclosure, there is provided a method of preparing the resistive random access memory 100 as described above. The method comprises steps S101-S103.

In step S101, a resistive layer 120 is formed on a substrate.

In step S102, a barrier structure is formed on the resistive layer 120.

In step S103, an upper electrode 150 is formed on the barrier structure.

The barrier structure is used to allow electrons to pass through a conduction band of the barrier structure when a device performs an erasing operation, so as to avoid forming of a defect in the resistive layer 120 and causing a reverse breakdown of the resistive layer 120.

The barrier structure includes an oxide layer not completely proportioned. As the barrier structure is formed between the resistive layer 120 and the upper electrode 150, during an erasing operation of the device, when an applied erasing voltage gradually increases, a conduction band energy level of the resistive layer 120 may be leveled with a conduction band energy level of the oxide layer, electrons pass through the conduction band of the barrier structure so as to avoid forming of too many defects in the resistive layer 120. Therefore, a reverse breakdown may not occur on the device, so that a durability of the device may be further improved.

As shown in FIG. 1 and FIG. 3, according to the embodiment of the present disclosure, the step 102 of forming the barrier structure on the resistive layer 120 includes: forming a barrier layer 130 on the resistive layer 120, the barrier layer 130 is used as a storage layer of oxygen ions when the device performs the erasing operation, so as to allow the electrons to pass through the conduction band of the barrier layer 130; and forming an intercalation layer 140 on the barrier layer 130, the intercalation layer 140 is used as an auxiliary storage layer of the oxygen ions when the device performs the erasing operation, so as to further prevent the oxygen ions from directly entering the upper electrode 150.

As shown in FIG. 1 and FIG. 3, according to the embodiment of the present disclosure, forming the barrier layer 130 on the resistive layer 120 includes: the barrier layer 130 is prepared by adjusting an oxygen flow ratio of a reactive sputtering process; the oxygen flow ratio is a ratio r between an oxygen flow $sccm_O$ and an inert gas flow $sccm_D$, wherein, $r \in [r_1, r_2]$, $r_1 = sccm_O : sccm_D = 2$ sccm:50 sccm, $r_2 = sccm_O : sccm_D = 8$ sccm:50 sccm. The inert gas may be argon Ar.

According to the embodiment of the present disclosure, a preparation condition of the reactive sputtering process further includes that: a substrate temperature is a room temperature, a power is 400 W, and an air pressure is 3 mtorr.

Specifically, when the $TaO_x$ barrier layer 130 is prepared on the $Ta_2O_5$ resistive layer 120, an oxygen content in the $TaO_x$ barrier layer 130 needs to be precisely controlled, and a value of x is in a range of 1.1-1.8. The oxygen content in the $TaO_x$ barrier layer 130 is adjusted by changing the oxygen flow ratio in the reactive sputtering process. Specific reaction parameters (i.e. reaction preparation conditions) of the reactive sputtering process are as follows: the substrate temperature is a room temperature, the O/Ar flow ratio is 2 sccm:50 sccm to 8 sccm:50 sccm, the power is 400 W, and the air pressure is 3 mtorr. The oxygen content in the $TaO_x$ barrier layer 130 is precisely controlled, so that a barrier height between the $TaO_x$ barrier layer 130 and the $Ta_2O_5$ resistive layer 120 may be adjusted to a desired range.

According to the embodiment of the present disclosure, forming the intercalation layer 140 on the barrier layer 130 includes: the intercalation layer is prepared by a sputtering process, an atomic layer deposition process, a physical vapor deposition process or a chemical vapor deposition process.

When the intercalation layer 140 is formed on an upper surface of the barrier layer 130 of the resistive layer 120, a material of the intercalation layer may be a metal, such as Ta or Ti, and it may also be a semiconductor material, such as a metal oxide, an amorphous silicon, an amorphous C or a graphene. The intercalation layer 140 may be prepared by the sputtering process (such as the reactive sputtering process), the atomic layer deposition process, the physical vapor deposition process, or the chemical vapor deposition process. A thickness of the intercalation layer 140 may be 2 nm-20 nm. The intercalation layer 140 is mainly used as the auxiliary storage layer of oxygen ions to further prevent the oxygen ions from entering the upper electrode 150, causing a failure of retention characteristics of the device.

As shown in FIG. 1 and FIG. 3, according to the embodiment of the present disclosure, the step 101 of forming the resistive layer 120 on the substrate includes: the resistive layer 120 is prepared by the reactive sputtering process, the atomic layer deposition process, a thermal oxidation process, a magnetron sputtering process or an ion beam sputtering process.

According to the embodiment of the present disclosure, the preparation condition of the reactive sputtering process includes that: the oxygen flow ratio is a ratio s between an oxygen flow $sccm_O$ and an inert gas flow $sccm_D$, wherein $s \in [s_1, s_2]$, $s_1 = sccm_O : sccm_D = 12$ sccm:50 sccm, $s_2 = sccm_O : sccm_D = 20$ sccm:50 sccm; the substrate temperature is the room temperature, the power is 400 W, and the air pressure is 3 mtorr. The inert gas may be argon Ar.

The $Ta_2O_5$ resistive layer 120 may be prepared on the lower electrode 110 by the reactive sputtering process, and the preparation condition of the reactive sputtering process includes that: the substrate temperature is the room temperature, the O/Ar flow ratio is 12 sccm:50 sccm-20 sccm:50 sccm, the power is 400 W, and the air pressure is 3 mtorr. The resistive layer 120 may also be prepared by the atomic layer deposition process, the thermal oxidation process, etc., or prepared by means of sputtering a $Ta_2O_5$ target by the magnetron sputtering process or the ion beam sputtering process.

As shown in FIG. 1 and FIG. 3, according to the embodiment of the present disclosure, before the step 101 of forming the resistive layer 120 on the substrate, the preparation method further includes: forming a lower electrode 110 on the substrate; a preparation process of the lower electrode 110 and the upper electrode 150 is the sputtering process, the atomic layer deposition process, the physical vapor deposition process or the chemical vapor deposition process.

Metal materials such as TiN or TaN are prepared on the substrate by means of the magnetron sputtering, the atomic layer deposition process, the physical vapor deposition process or the chemical vapor deposition process to form the lower electrode 110. A thickness of the lower electrode 110 is 20 nm-500 nm and it has a conductive effect.

When the upper electrode 150 is formed on the intercalation layer 140, a material of the upper electrode 150 is not limited, and it may be Ir, Al, Ru, Pd, TiN or TaN. A thickness of the upper electrode 150 is 20 nm-500 nm, and it has a conductive connectivity effect as a conductive electrode of the device.

Figures 4, 5:
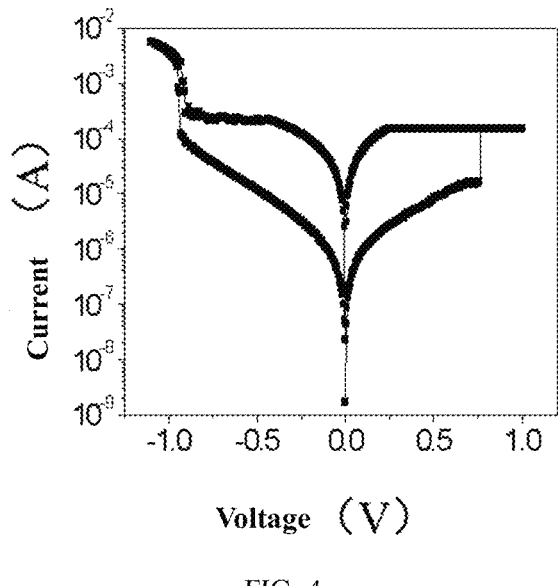
FIG. 4 schematically shows a standard IV characteristic curve of a resistive random access memory according to an embodiment of the present disclosure.
FIG. 5 schematically shows a diagram of a number of resistance switching cycles of a resistive random access memory according to an embodiment of the present disclosure.

As shown in FIG. 4, according to a standard IV characteristic curve of a resistive random access memory according to an embodiment of the present disclosure, the device has an obvious threshold transition characteristic during the erasing process, and may have a maximum current value up to 4 mA. However, the resistance state of the device may not change under a reading voltage. Therefore, by using the barrier structure of the resistive random access memory according to the embodiment of the present disclosure, the problem of the reverse breakdown of the resistive device may be avoided, thereby improving the durability of the device. At the same time, by using this device, a selection range of the erasing voltage is enlarged, and an uniformity of the high resistance state is improved.

As shown in FIG. 5, the resistive random access memory in the embodiment of the present disclosure may avoid a problem of overprogramming during the erasing process through the barrier layer and the intercalation layer of the barrier structure. The device has a good durability and may be stably cycled for more than 100,000 times. Moreover, the device has a uniform distribution of high and low resistance states.

It may be seen from the above-mentioned embodiments that in the resistive random access memory and the method of preparing the same provided by the present disclosure, an oxide layer not completely proportioned is added between the resistive layer and the upper electrode as the barrier structure. During the erasing operation of the device, when an applied erasing voltage gradually increases, the conduction band energy level of the resistive layer may be leveled with the conduction band energy level of the oxide layer, and the electrons pass through the conduction band of the barrier structure, so as to avoid forming of too many defects in the resistive layer. Therefore, the reverse breakdown may not occur on the device, so that the durability of the device is further improved.

So far, the embodiments of the present disclosure have been described in detail with reference to the accompanying drawings. Based on the above-mentioned description, those skilled in the art should have a clear understanding of the present disclosure.

The specific embodiments described above have further described the objectives, technical solutions and beneficial effects of the present disclosure in detail. It should be understood that the above-mentioned description are only specific embodiments of the present disclosure, and are not intended to limit the present disclosure. Within the spirit and principle of the present disclosure, any modifications, equivalent replacements, improvements, etc., shall be included in the protection scope of the present disclosure.

What is claimed is:

1. A resistive random access memory, comprising:
a resistive layer arranged on a substrate, and the resistive layer is configured to cause a device to generate a high resistance state or a low resistance state when the device performs a writing operation or an erasing operation;
an upper electrode, arranged on the resistive layer, and the upper electrode is configured as an extraction electrode of the device; and
a barrier structure arranged between the resistive layer and the upper electrode, and the barrier structure is configured for an electron to pass through a conduction band of the barrier structure when the device performs the erasing operation, so as to avoid forming of a defect in the resistive layer and causing a reverse breakdown of the resistive layer,
wherein the barrier structure comprises: a barrier layer arranged on the resistive layer, and the barrier layer is configured as a storage layer of oxygen ions when the device performs the erasing operation, so that the electron passes through the conduction band of the barrier layer; and an intercalation layer arranged between the barrier layer and the upper electrode, and the intercalation layer is configured as an auxiliary storage layer of the oxygen ions when the device performs the erasing operation, so as to further prevent the oxygen ions from directly entering the upper electrode;
wherein a material of the resistive layer is $Ta_2O_5$;
wherein a material of the barrier layer is $TaO_x$, wherein $x \in [1.1, 1.8]$;
wherein a material of the intercalation layer is at least one of Ta, Ti, a metal oxide, an amorphous silicon, an amorphous carbon and a graphene, wherein a thickness of the intercalation layer is 2 nm-20 nm; and
wherein a barrier between the barrier layer and the resistive layer is 0.45 eV-0.65 eV.

2. The resistive random access memory according to claim 1, further comprising:
a lower electrode arranged between the resistive layer and the substrate, and the lower electrode is configured as another extraction electrode of the device.

3. The resistive random access memory according to claim 2,
wherein a material of the lower electrode is at least one of TIN and TaN:
wherein a material of the upper electrode is at least one of Ir, Al, Ru, Pd, TiN and TaN; and
wherein a thickness of the lower electrode and a thickness of the upper electrode are 20 nm-500 nm, respectively.

4. A method of preparing the resistive random access memory according to claim 1, comprising:
forming a resistive layer on a substrate;
forming a barrier structure on the resistive layer;
forming an upper electrode on the barrier structure;
wherein the barrier structure is configured for electrons to pass through a conduction band of the barrier structure when a device performs an erasing operation, so as to avoid forming of a defect in the resistive layer and causing a reverse breakdown of the resistive layer.

5. The method according to claim 4, wherein the forming a barrier structure on the resistive layer comprises:
forming a barrier layer on the resistive layer, wherein the barrier layer is configured as a storage layer of oxygen ions when the device performs the erasing operation, so as to allow the electrons to pass through a conduction band of the barrier layer; and
forming an intercalation layer on the barrier layer, wherein the intercalation layer is configured as an auxiliary storage layer of the oxygen ions when the device performs the erasing operation, so as to further prevent the oxygen ions from directly entering the upper electrode.

6. The method according to claim 5, wherein the forming a barrier layer on the resistive layer comprises:
preparing the barrier layer by adjusting an oxygen flow ratio of a reactive sputtering process; and
wherein the oxygen flow ratio is a ratio r between an oxygen flow $sccm_O$ and an inert gas flow $sccm_D$, wherein $r \in [r_1, r_2]$, $r_1 = sccm_O:sccm_D = 2$ sccm:50 sccm, $r_2 = sccm_O:sccm_D = 8$ sccm:50 sccm.

7. The method according to claim 6, wherein a preparation condition of the reactive sputtering process further comprises: a substrate temperature is a room temperature, a power is 400 W, and an air pressure is 3 mtorr.

8. The method according to claim 5, wherein the forming an intercalation layer on the barrier layer comprises:
preparing the intercalation layer by a sputtering process, an atomic layer deposition process, a physical vapor deposition process or a chemical vapor deposition process.

9. The method according to claim 4, wherein the forming a resistive layer on a substrate comprises:
preparing the resistive layer by a reactive sputtering process, an atomic layer deposition process, a thermal oxidation process, a magnetron sputtering process or an ion beam sputtering process.

10. The method according to claim 9, wherein a preparation condition of the reactive sputtering process comprises:
an oxygen flow ratio is a ratio s between an oxygen flow $sccm_O$ and an inert gas flow $sccm_D$, wherein $s \in [s_1, s_2]$, $s_1 = sccm_O:sccm_D = 12$ sccm:50 sccm, $s_2 = sccm_O:$

11

12

$sccm_D$=20 sccm:50 sccm; and a substrate temperature is a room temperature, a power is 400 W, and an air pressure is 3 mtorr.

11. The method according to claim 4, wherein before forming a resistive layer on a substrate, the method further comprises:

forming a lower electrode on the substrate; and wherein a preparation process of the lower electrode and the upper electrode is a sputtering process, an atomic layer deposition process, a physical vapor deposition process or a chemical vapor deposition process.

\* \* \* \* \*